(12) United States Patent
Kubena et al.

(10) Patent No.: US 7,994,877 B1
(45) Date of Patent: Aug. 9, 2011

(54) MEMS-BASED QUARTZ HYBRID FILTERS AND A METHOD OF MAKING THE SAME

(75) Inventors: Randall L. Kubena, Oak Park, CA (US); David T. Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 222 days.

(21) Appl. No.: 12/268,309

(22) Filed: Nov. 10, 2008

(51) Int. Cl.
- H03H 9/02 (2006.01)
- H03H 9/05 (2006.01)
- H03H 9/15 (2006.01)
- H03H 9/54 (2006.01)
- H03H 7/00 (2006.01)

(52) U.S. Cl. ........................................ 333/187; 333/185

(58) Field of Classification Search .................. 333/167, 333/175, 185, 187–189
See application file for complete search history.

(56) References Cited

U.S. PATENT DOCUMENTS

| | | | |
|---|---|---|---|
| 2,487,165 A | 11/1949 | Miller | 310/363 |
| 3,390,287 A | 6/1968 | Hans | 310/329 |
| 3,766,616 A | 10/1973 | Staudte | |
| 4,364,016 A | 12/1982 | Tanski | |
| 4,442,574 A | 4/1984 | Wanuga et al. | |
| 4,618,262 A | 10/1986 | Maydan et al. | 356/357 |
| 4,870,313 A | 9/1989 | Hirama et al. | 310/320 |
| 4,944,836 A | 7/1990 | Beyer et al. | 156/645 |
| 5,260,596 A | 11/1993 | Dunn et al. | |
| 5,480,747 A | 1/1996 | Vasudev | 430/5 |
| 5,530,408 A | 6/1996 | Vig et al. | 331/69 |
| 5,552,016 A | 9/1996 | Ghanayem | 156/999.999 |
| 5,589,724 A | 12/1996 | Satoh et al. | 310/348 |
| 5,605,490 A | 2/1997 | Laffey et al. | |
| 5,648,849 A | 7/1997 | Canteloup et al. | 356/357 |
| 5,658,418 A | 8/1997 | Coronel et al. | 156/345 |
| 5,666,706 A | 9/1997 | Tomita et al. | |
| 5,668,057 A | 9/1997 | Eda et al. | 438/113 |
| 5,928,532 A | 7/1999 | Koshimizu et al. | 219/121.42 |
| 5,942,445 A | 8/1999 | Kato et al. | 438/691 |
| 5,981,392 A | 11/1999 | Oishi | 438/691 |
| 6,049,702 A * | 4/2000 | Tham et al. | 455/78 |
| 6,081,334 A | 6/2000 | Grimbergen et al. | 356/357 |
| 6,114,801 A | 9/2000 | Tanaka | |
| 6,204,737 B1 * | 3/2001 | Ella | 333/187 |

(Continued)

FOREIGN PATENT DOCUMENTS

EP 0 531 985 3/1993

(Continued)

OTHER PUBLICATIONS

English language machine translation of JP 6-318533, published on Nov. 15, 1994.*

(Continued)

*Primary Examiner* — Barbara Summons
(74) *Attorney, Agent, or Firm* — Ladas & Parry

(57) ABSTRACT

An integrated Micro-Electro-Mechanical Systems (MEMS) filter includes an insulating substrate bonded to a base substrate such that at least a portion of the insulating substrate is separated from the base substrate by a gap, the insulating substrate having a first side and a second side, an inductive element having a coil, wherein the coil of the inductive element is on the insulating substrate, and a capacitive element having two conductive plates, wherein one of the two conductive plates is on the insulating substrate.

13 Claims, 12 Drawing Sheets

U.S. PATENT DOCUMENTS

| | | | |
|---|---|---|---|
| 6,207,008 B1 | 3/2001 | Kijima | 216/2 |
| 6,297,064 B1 | 10/2001 | Koshimizu | 438/9 |
| 6,413,682 B1 | 7/2002 | Shibano et al. | 430/5 |
| 6,417,925 B1 | 7/2002 | Naya | 356/445 |
| 6,424,418 B2 | 7/2002 | Kawabata et al. | 356/445 |
| 6,426,296 B1 | 7/2002 | Okojie | 438/692 |
| 6,432,824 B2 | 8/2002 | Yanagisawa | 438/691 |
| 6,514,767 B1 | 2/2003 | Natan | 436/166 |
| 6,614,529 B1 | 9/2003 | Tang | 356/381 |
| 6,627,067 B1 | 9/2003 | Branton et al. | 205/778 |
| 6,710,681 B2 * | 3/2004 | Figueredo et al. | 333/187 |
| 6,750,728 B2 | 6/2004 | Takahashi et al. | |
| 6,756,304 B1 | 6/2004 | Robert | 438/667 |
| 6,768,396 B2 * | 7/2004 | Klee et al. | 333/187 |
| 6,815,228 B2 | 11/2004 | Usui et al. | 438/14 |
| 6,862,398 B2 | 3/2005 | Elkind et al. | 356/445 |
| 6,933,164 B2 | 8/2005 | Kubena | 438/49 |
| 6,943,484 B2 * | 9/2005 | Clark et al. | 310/334 |
| 7,057,331 B2 | 6/2006 | Shimodaira et al. | 310/344 |
| 7,118,657 B2 | 10/2006 | Golovchenko et al. | 204/192.3 |
| 7,224,245 B2 * | 5/2007 | Song et al. | 333/133 |
| 7,232,700 B1 | 6/2007 | Kubena | 438/51 |
| 7,237,315 B2 | 7/2007 | Kubena et al. | 29/25.35 |
| 7,317,354 B2 * | 1/2008 | Lee | 330/200 |
| 7,446,628 B2 * | 11/2008 | Morris, III | 333/132 |
| 7,459,099 B2 | 12/2008 | Kubena et al. | 216/57 |
| 7,459,992 B2 * | 12/2008 | Matsuda et al. | 333/133 |
| 7,479,846 B2 * | 1/2009 | Inoue et al. | 333/133 |
| 7,490,390 B2 * | 2/2009 | Kawakubo et al. | 29/25.35 |
| 7,551,054 B2 * | 6/2009 | Mizuno et al. | 336/200 |
| 7,557,493 B2 | 7/2009 | Fujimoto | 310/349 |
| 7,559,130 B2 | 7/2009 | Kubena et al. | 29/594 |
| 7,564,177 B2 | 7/2009 | Yoshimatsu | 310/365 |
| 7,579,748 B2 | 8/2009 | Kuroda | 310/312 |
| 7,579,926 B2 * | 8/2009 | Jhung | 333/133 |
| 7,663,196 B2 * | 2/2010 | Liu et al. | 257/416 |
| 7,671,427 B2 * | 3/2010 | Kim et al. | 257/414 |
| 7,791,431 B2 | 9/2010 | Piazza et al. | 333/186 |
| 7,872,548 B2 * | 1/2011 | Nishihara et al. | 333/133 |
| 2002/0072246 A1 | 6/2002 | Goo et al. | 438/782 |
| 2002/0074947 A1 | 6/2002 | Tsukamoto | 315/169.3 |
| 2002/0185611 A1 | 12/2002 | Menapace et al. | 65/392 |
| 2003/0003608 A1 | 1/2003 | Arikado et al. | 257/618 |
| 2003/0205948 A1 * | 11/2003 | Lin et al. | 310/312 |
| 2004/0065864 A1 | 4/2004 | Vogt et al. | 51/308 |
| 2004/0211052 A1 | 10/2004 | Kubena et al. | 29/594 |
| 2005/0034822 A1 * | 2/2005 | Kim et al. | 159/5 |
| 2005/0093659 A1 * | 5/2005 | Larson et al. | 333/191 |
| 2006/0016065 A1 | 1/2006 | Nagaura | 310/361 |
| 2006/0022556 A1 | 2/2006 | Bail et al. | 310/344 |
| 2006/0055479 A1 | 3/2006 | Okazaki et al. | 331/158 |
| 2006/0066419 A1 * | 3/2006 | Iwaki et al. | 333/133 |
| 2006/0139121 A1 * | 6/2006 | Jhung | 333/133 |
| 2006/0197619 A1 | 9/2006 | Oishi et al. | 331/158 |
| 2006/0252906 A1 | 11/2006 | Godschalx et al. | 528/86 |
| 2007/0205839 A1 | 9/2007 | Kubena et al. | 331/158 |
| 2008/0034575 A1 | 2/2008 | Chang et al. | 29/594 |
| 2008/0074661 A1 | 3/2008 | Zhang | 356/301 |
| 2009/0146527 A1 | 6/2009 | Lee | 310/312 |

FOREIGN PATENT DOCUMENTS

| | | | |
|---|---|---|---|
| JP | 57-091017 | | 6/1982 |
| JP | 04322507 | | 11/1992 |
| JP | 6-318533 | * | 11/1994 |
| JP | 08330878 | | 12/1996 |
| JP | 9-247025 | * | 9/1997 |
| JP | 2003-318685 | A | 11/2003 |
| JP | 2005-180921 | A | 7/2005 |
| JP | 2006-352487 | | 12/2006 |
| KR | 10-2001-0110428 | A | 12/2001 |
| WO | 84-00082 | | 1/1984 |

OTHER PUBLICATIONS

Abe, T., et al., "One-Chip Multichannel Quartz crystal microbalance (QCM) Fabricated by Deep RIE," Sensors and Actuators, 2000, pp. 139-143.

Aaltonen, T., et al., "ALD of Rhodium thin films from Rh(acac)$_3$ and Oxygen," Electrochemical and Solid-State Lett. 8, C99 (2005).

Cleland, A.N., et al., "Fabrication of High Frequency Nanometer Scale Mechanical Resonators From Bulk Si Crystals,"applied Physics Letters, Oct. 28, 1996.

Evoy, S., et al., "Temperature-dependent Internal Friction in Silicon Nanoelectromechanical Systems," Applied Physics Letters, vol. 77, No. 15, Oct. 9, 2000.

Greer, J.A., et al., "Properties of SAW resonators fabricated on quartz substrates of various qualities," Ultrasonics Symposium, 1994 IEEE, vol. 1, Nov. 1-4, 1994, pp. 31-36.

Lin, J.W, et al., "A Robust High-Q Micromachined RF Inductor for RFIC Applications," IEEE Transactions on Electronic Devices, vol. 52, No. 7, pp. 1489-1496 (Jul. 2005).

Park, K.J., et al., "Selective area atomic layer deposition of rhodium and effective work function characterization in capacitor structures," Applied Physics Letters 89, 043111 (2006).

Sirbuly, Donald J. et al., Multifunctional Nanowire Evanescent Wave Optical Sensors,' Advanced Materials, 2007 (published online: Dec. 5, 2006), 19, pp. 61-66.

White, Lan M., et al., Increasing the Enhancement of SERS with Dielectric Microsphere Resonators,' Spectroscopy-Eugene, Apr. 2006.

Yan, Fei, et al., "Surface-enhanced Raman scattering (SERS) detection for chemical and biological agents," IEEE Sensors Journal, vol. 5, No. 4, Aug. 2005.

* cited by examiner

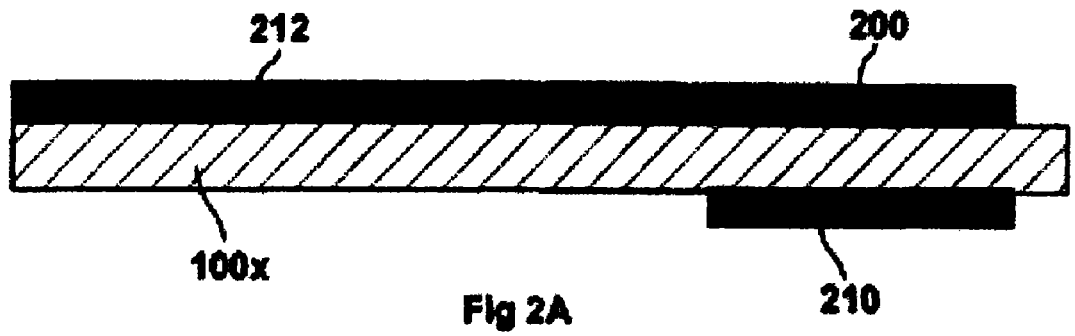
Fig 2A
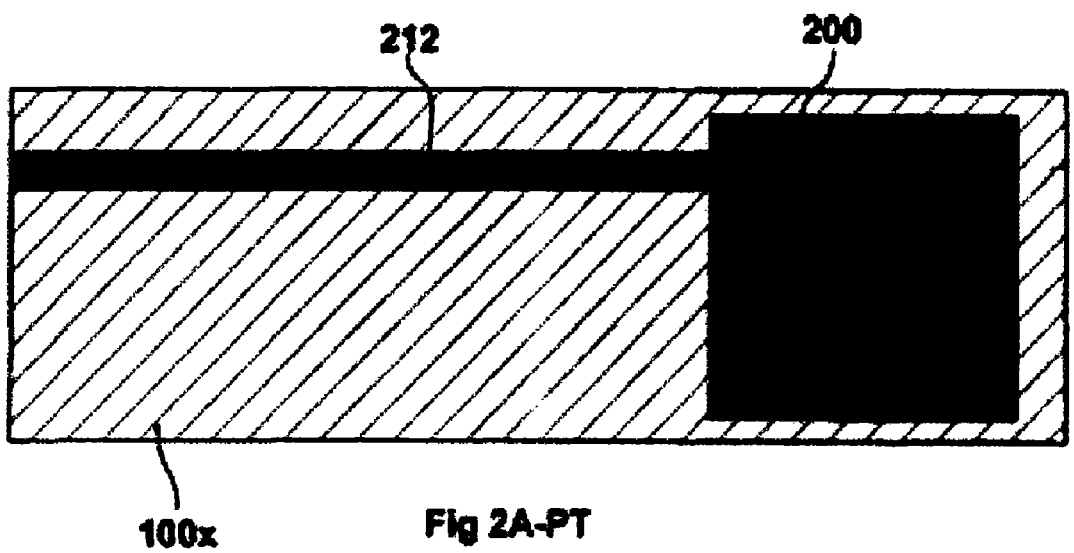
Fig 2A-PT
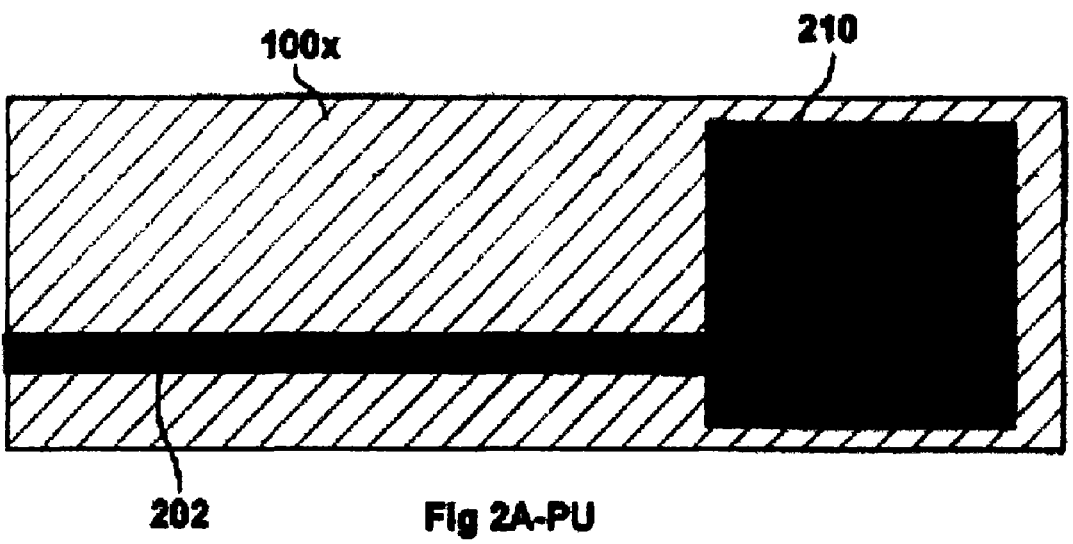
Fig 2A-PU

Fig 3A-P

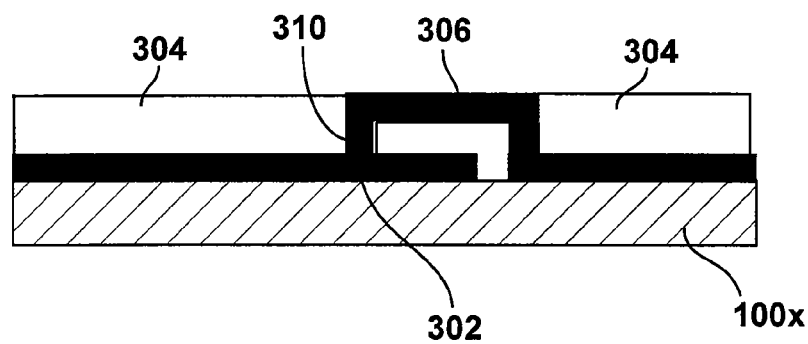
Fig 3D
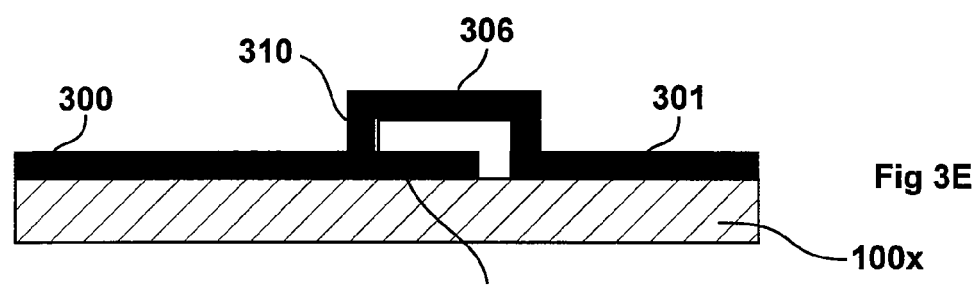
Fig 3E
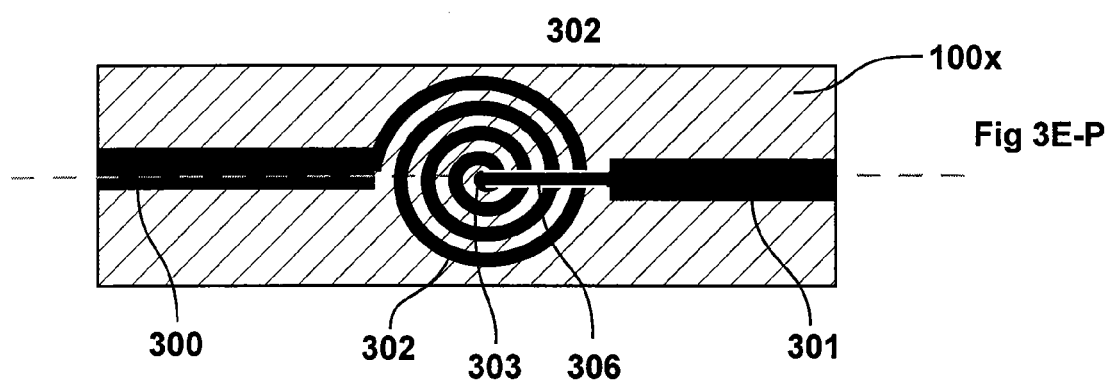
Fig 3E-P

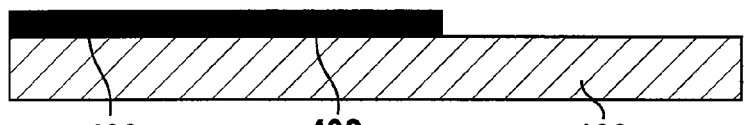
Fig 4A
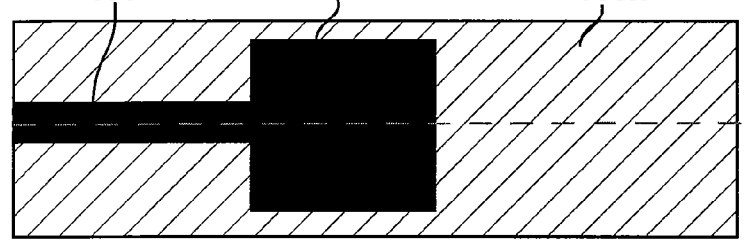
Fig 4A-P
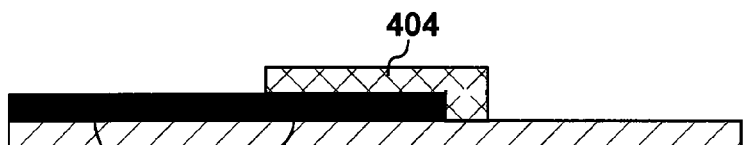
Fig 4B
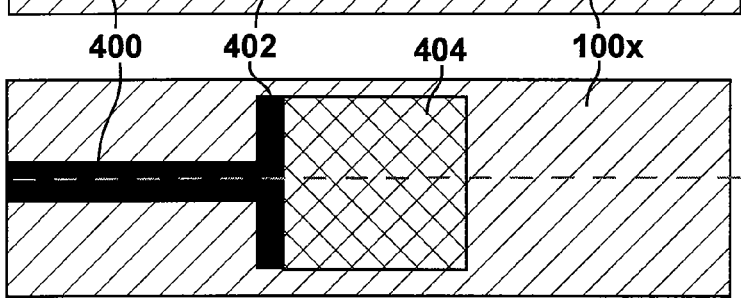
Fig 4B-P
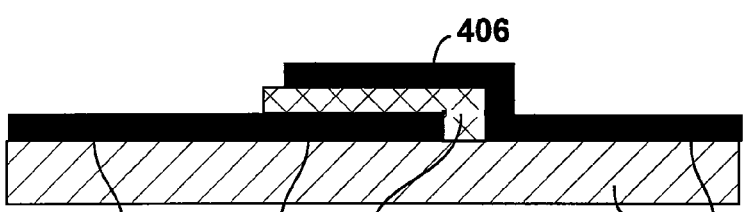
Fig 4C
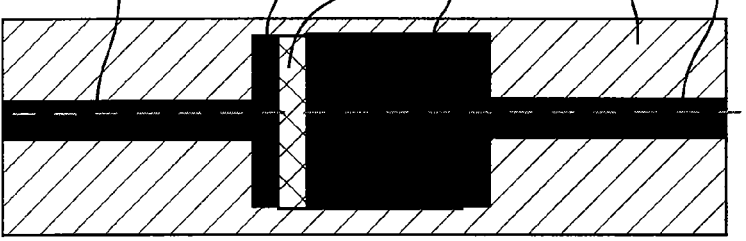
Fig 4C-P

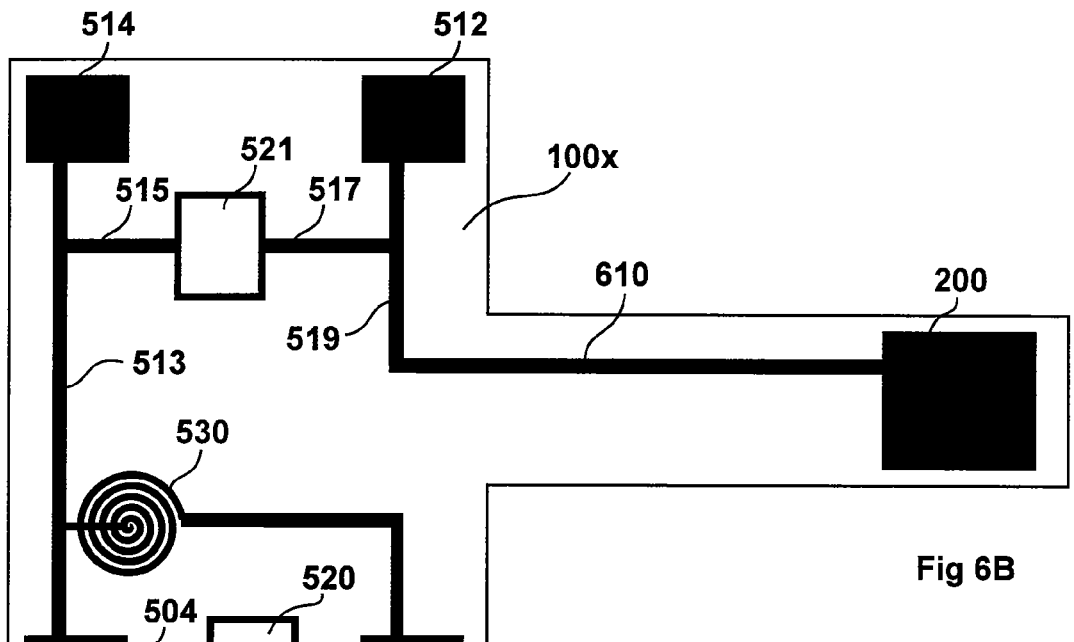
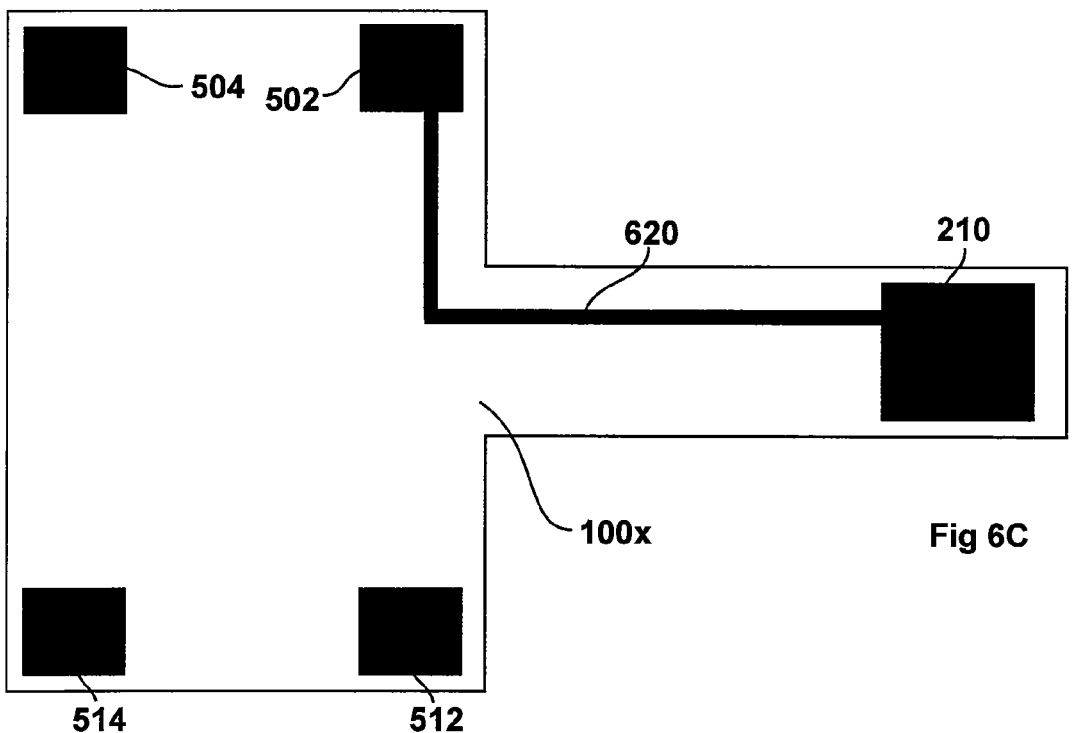
Fig 6B
Fig 6C

```
┌─────────────────────────────────────────────────┐
│ BONDING THE INSULATING SUBSTRATE TO A BASE      │
│ SUBSTRATE SUCH THAT AT LEAST A PORTION OF THE   │
│ INSULATING SUBSTRATE IS SEPARATED FROM THE BASE │
│ SUBSTRATE BY A GAP                          720 │
└─────────────────────────────────────────────────┘
                         │
┌─────────────────────────────────────────────────┐
│ METALLIZING A RESONATOR ELEMENT ON THE INSULATING│
│ SUBSTRATE                                        │
│                                              722 │
└─────────────────────────────────────────────────┘
                         │
┌─────────────────────────────────────────────────┐
│   METALLIZING A FIRST ELECTRODE ON A FIRST SIDE OF│
│ THE INSULATING SUBSTRATE                     724 │
└─────────────────────────────────────────────────┘
                         │
┌─────────────────────────────────────────────────┐
│  METALLIZING A SECOND ELECTRODE ON A SECOND SIDE │
│  OF THE INSULATING SUBSTRATE OPPOSITE THE FIRST SIDE│
│                                              726 │
└─────────────────────────────────────────────────┘
```

Fig. 7B

MEMS-BASED QUARTZ HYBRID FILTERS AND A METHOD OF MAKING THE SAME

CROSS REFERENCE TO RELATED APPLICATION

This application is related to the disclosure of U.S. patent application Ser. No. 10/426,931 filed Apr. 30, 2003, entitled "Quartz-Based Nanoresonators and Method of Fabricating Same", which is incorporated herein by reference as though set forth in full.

BACKGROUND OF THE INVENTION

This invention addresses the integration of passive components such as inductors and capacitors onto a quartz film, for example, which may be suspended over a substrate by wafer bonding techniques. The U.S. patent application entitled "Quartz-Based Nanoresonators and Method of Fabricating Same" (U.S. Ser. No. 10/426,931) covers the fabrication process and resonator design for integrating VHF-UHF quartz mechanical resonators with active circuitry using handle wafer technology, wafer bonding, and final resonator release. This disclosure extends that disclosure by describing a method and device design whereby RF passive components are integrated directly on the quartz film, thereby providing wide-band filters, such as hybrid quartz filters or LC filters with low loss and low parasitics, and a method of producing same. This technology gives a filter designer numerous options for optimizing ladder filters using various combinations of high Q resonators, low loss inductors, and small capacitors with minimal parasitics.

Many filter designs require various combinations of active resonators, inductors, and capacitors connected in so-called ladder networks. These ladder network designs provide a large flexibility in producing filters with matched impedances, wide bandwidth range, and high out-of-band rejection. Previously, for monolithic integration, the inductors and capacitors were usually added to existing silicon integrated circuits (ICs) using conventional lithography techniques. If quartz resonators were added for high Q applications, the quartz device was added as a hybrid and attached to the circuitry of the IC using wire bond attachments. This prior art technique produces stray capacitance which can affect the filter performance, especially at VHF and UHF frequencies and higher frequencies. In addition, the RF loss in the substrate reduces the circuit's Q and can thereby increase the insertion loss. By adding some of all of the passive components directly on the quartz film using the presently disclosed quartz Micro-Electro-Mechanical Systems (MEMS) process, the RF losses and stray capacitances can be minimized. This allows one to produce filters with higher Q, lower insertion loss, and wider bandwidth in very compact designs. Lowering the parasitic capacitances improves the filter performance and also simplifies the design and fabrication of the filters since these parasitic capacitances do not have to be compensated for comparison to an ideal design without parasitic capacitance thereby reducing the manufacturing cost and improving the performance of the filter.

There exist many applications for narrow-to-wide band filters having small form factors. These applications includes advanced radio and communication systems as well as radar systems, all of which need filters having low insertion loss and small size for multi-spectral systems.

Traditional compact filters are typically manufactured either as hybrids (when mechanical resonators are used) or as integrated circuit elements (for passive components) on a silicon or group III-V semiconductor wafer. Although many filters designs have been investigated using a combination of mechanical resonators and passive Ls (inductors) and Cs (capacitors), integrating these elements on an active substrate while maintaining high Q and low loss has not been easy. Integrating a mechanical resonator directly on a silicon substrate leads to mechanical energy loss while placing Ls and Cs on silicon wafers leads to RF losses in the substrate. In some previous work, the Si substrate has been removed to reduce these losses, but this increases the complexity of the process, reduces packaging density, hinders the ultimate miniaturization, and makes CMOS processing more expensive. See "A Robust High-Q Micromachined RF Inductor for RFIC application," Ji-Wei Lin, et al., *IEEE Transactions on Electron Devices*, Vol. 52, No. 7, pp. 1489-1496, July, 2005. Thus, by placing all the elements on a thin quartz film suspended over the substrate, as is disclosed herein, one can isolate the mechanical modes using conventional energy trapping techniques used by the quartz industry while minimizing RF losses and parasitics for the passive components. This is especially important at higher frequencies where parasitics begin to play a dominant role in the performance characteristics. In addition, ultra-small LC ladder filters can be fabricated at much higher frequencies than previously thought possible for wide bandwidth and tunable applications.

SUMMARY OF THE INVENTION

In a first embodiment disclosed herein, an integrated Micro-Electro-Mechanical Systems (MEMS) filter includes an insulating substrate bonded to a base substrate such that at least a portion of the insulating substrate is separated from the base substrate by a gap, the insulating substrate having a first side and a second side, an inductive element having a coil, wherein the coil of the inductive element is on the insulating substrate, and a capacitive element having two conductive plates, wherein one of the two conductive plates is on the insulating substrate.

In one aspect the insulating substrate is quartz.

In another aspect the inductive element includes a conductive spiral having a center contact point on the insulating substrate, a further contact point exterior to the spiral on the insulating substrate, and a conductive bridge connecting the center contact point of the conductive spiral to the further contact point.

In yet another aspect the capacitive element includes a first conductive plate on the insulating substrate, a dielectric layer on the first conductive plate, and a second conductive plate on the dielectric layer.

In another aspect integrated MEMS filter further includes a piezoelectric resonator element that includes a first electrode plate on the first side of the insulating substrate, and a second electrode plate on the second side of the insulating substrate, positioned opposite to the first electrode plate such that the insulating substrate positioned between the first electrode plate and the second electrode plate is able to act as the resonator plate substrate for the resonator element.

In yet another aspect the insulating substrate is crystalline quartz.

In another embodiment disclosed herein, a process for fabricating an integrated Micro-Electro-Mechanical Systems (MEMS) filter includes integrating an inductive element and a capacitive element onto an insulating substrate; and bonding the insulating substrate to a base substrate such that at least a portion of the insulating substrate is separated from the base substrate by a gap.

In one aspect the step of integrating includes metallizing a first side of the insulating substrate, attaching a handle wafer to the first side of the insulating substrate, thinning and etching vias in the insulating substrate, metallizing the second side of the insulating substrate, and releasing the handle wafer from the insulating substrate.

In another aspect the step of attaching a handle wafer includes depositing a release layer on a first side of the insulating substrate, and deposing a handle wafer on the release layer, wherein the step of releasing the handle wafer includes etching away the release layer.

In another aspect the handle wafer has perforations for assisting in etching away the release layer.

In yet another aspect the bonding step includes low-temperature pressure bonding.

In another aspect the process further includes metallizing a resonator element on the insulating substrate. The step of metallizing a resonator element may include metallizing a first electrode on a first side of the insulating substrate, and metallizing a second electrode on a second side of the insulating substrate opposite the first side.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 2A depicts an example of a MEMS quartz filter resonator. FIG. 2A-PT shows the top-side plan view of FIG. 2A in accordance with the present disclosure. FIG. 2A-PU shows the under-side plan view of FIG. 2A in accordance with the present disclosure.

FIGS. 3A-3E depict an example of how to fabricate a MEMS quartz filter inductor in accordance with the present disclosure. FIGS. 3A-P shows the plan view of FIG. 3A. FIGS. 3E-P shows the plan view of FIG. 3E in accordance with the present disclosure.

FIGS. 4A-4C depicts an example of how to fabricate a MEMS quartz filter capacitor in accordance with the present disclosure. FIGS. 4A-P to 4C-P show the plan views of FIGS. 4A-4C respectfully in accordance with the present disclosure.

FIGS. 6A-6D depict the structure of an example MEMS quartz filter to implement the circuit diagram of FIG. 5 in accordance with the present disclosure.

FIGS. 7A and 7B are flow diagrams of a process for fabricating an integrated Micro-Electro-Mechanical Systems (MEMS) filter in accordance with the present invention.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The descriptions below describe the use of quartz as a substrate, however other equivalent insulating materials can be used, such as diamond.

Figure 1A:
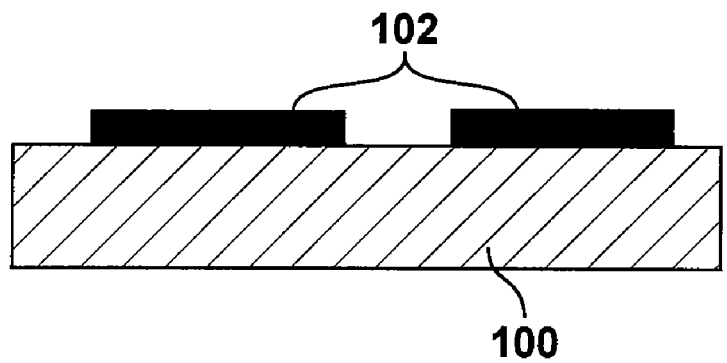
FIGS. 1A-1F depict an example of the steps that can be used to provide the layers for a MEMS quartz filter in accordance with the present disclosure.
Figure 1B:
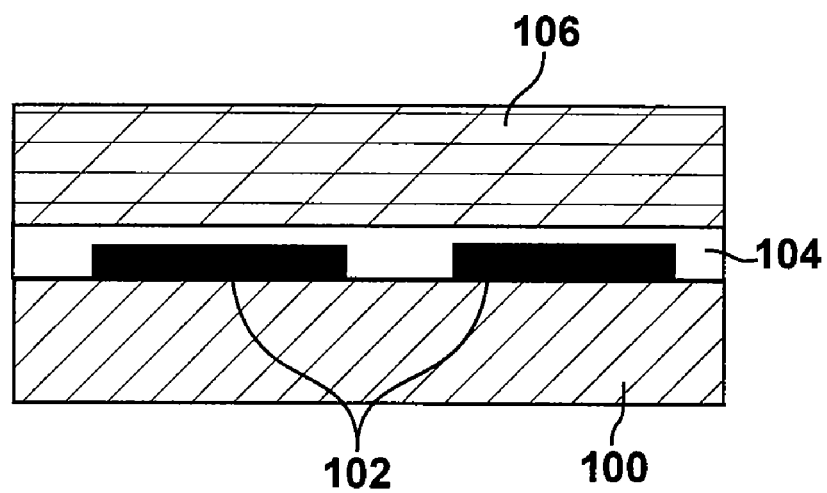
Figure 1C:
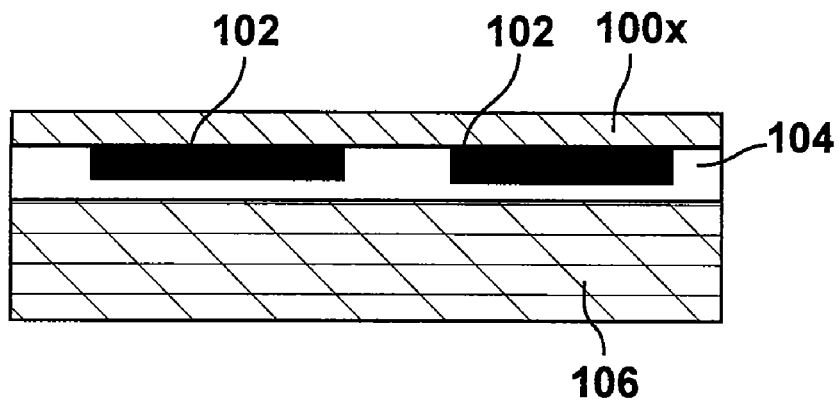
Figure 1D:
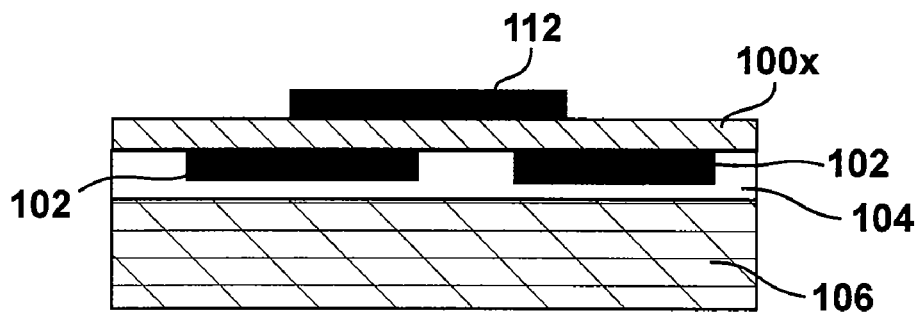
Figure 1E:
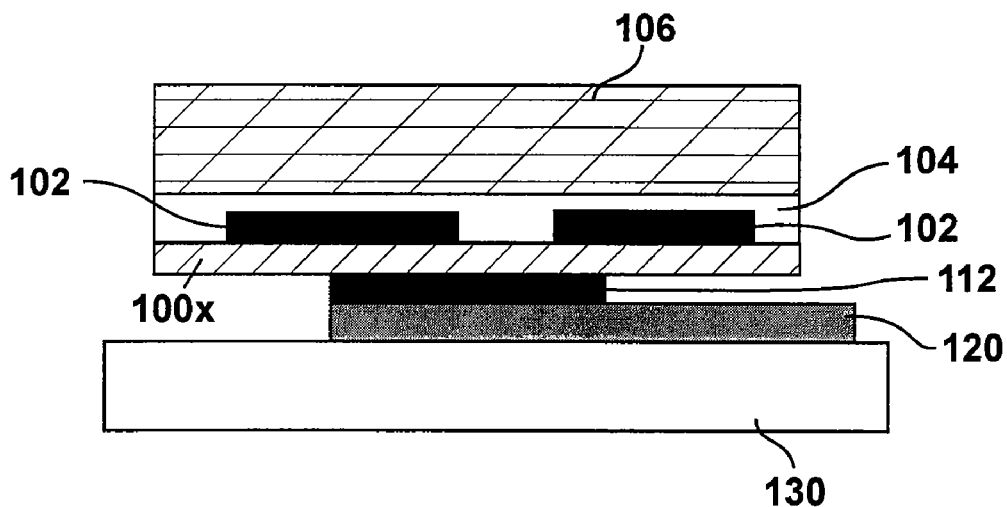
Figure 1F:
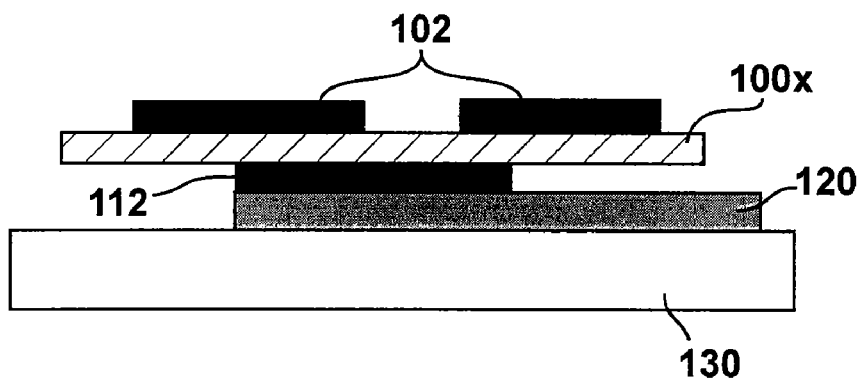

FIGS. 1A-1F show an example of how, in general, to create a MEMS quartz filter. FIG. 1A shows a quartz substrate 100, which may be crystalline quartz, with top-side metallization 102 for the various filter components and interconnects deposited. FIG. 1B shows the deposition of a release layer 104, which may be made of a material such as silicon that can be etched away without damaging the quartz substrate 100 or the top-side metallization 102, and a handle wafer 106 which may be made of quartz or silicon. FIG. 1C shows FIG. 1B flipped over with a thinned down quartz substrate 100x. The quartz substrate 100x may be thinned for example by milling or grinding and polishing. FIG. 1D shows under-side metallization 112 deposited on the thinned-down quartz substrate 100x. FIG. 1E shows FIG. 1D flipped over and the under-side metallization 112 bonded, for example with a low-temperature pressure bond, to a bond pad 120 on a base substrate 130. FIG. 1F shows the wafer with the handle wafer removed by etching away the release layer 104, which also removes handle wafer 106.

FIG. 2A shows an example resonator design for a MEMS quartz resonator. The resonator consists of a top-side electrode 200 opposite an under-side electrode 210 on the thinned-down quartz substrate 100x. The resonator can be physically isolated from the other filter components by means of a relatively long top-side conductive conduit 212 from the top-side electrode 200 and an under-side conductive conduit 202 from the under-side electrode 210. FIG. 2A-PT shows the top-side plan view of FIG. 2A and FIG. 2A-PU shows the under-side plan view of 2A. As shown in FIGS. 2A-PT and 2A-PU, the top-side conductive conduit 202 and the under-side conductive conduit 212 can be positioned so they are not aligned directly opposite each other.

Figure 3A:
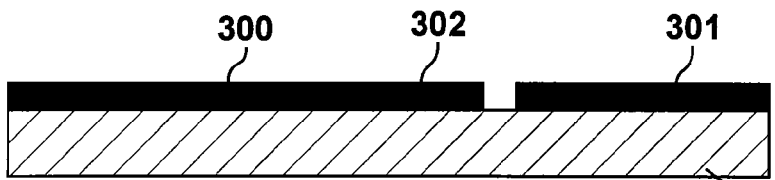
Figure 3B:
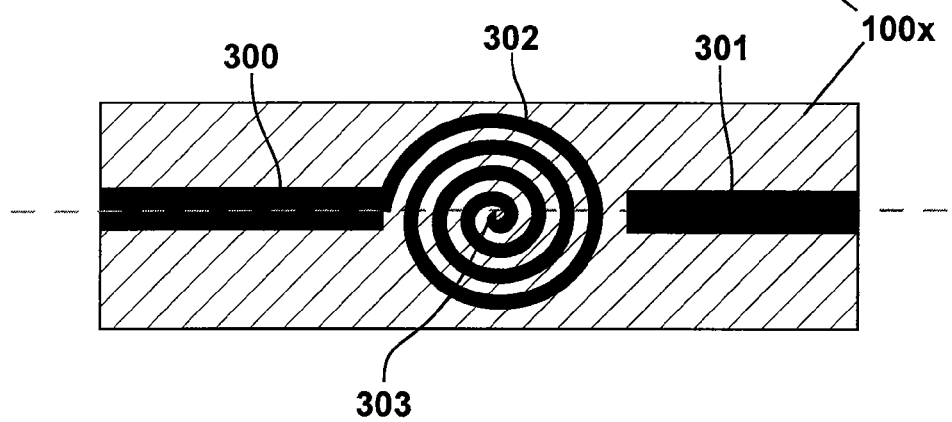
Figure 3B:
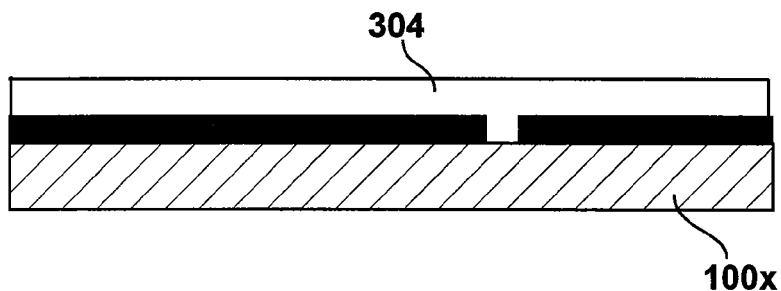
Figure 3C:
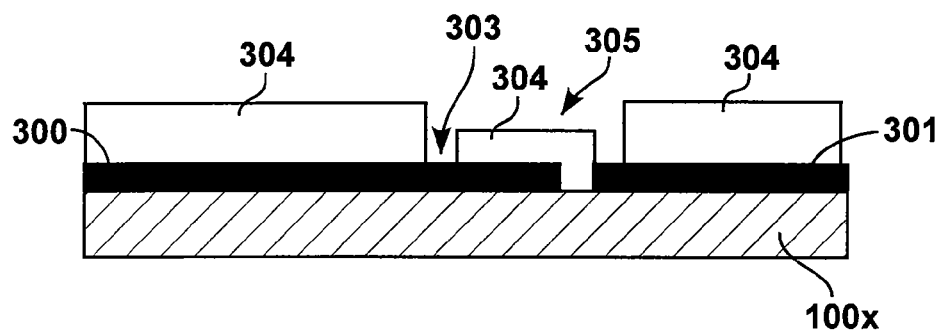

FIGS. 3A-3E (along with plan views 3A-P and 3E-P) show an example of the creation of a inductor for a MEMS quartz filter. FIGS. 3A and 3A-P (plan view of 3A) show the deposition of a metal spiral 302 on the thinned-down quartz substrate 100x. The spiral 302 is connected on the outside ring to a conductive conduit 300 connecting the inductor to the rest of the filter circuit (not shown in FIG. 3A). Another conductive conduit 301 is laid down near, but not yet connected to, the spiral 302. FIG. 3B shows the deposition of a releasable material 304, such as silicon or photoresist, over the spiral 302 and surrounding area. FIG. 3C shows a masked etching of the releasable material 304 to create the space 305 for a bridge between the non-connected conductive conduit 301 and the center 303 of the spiral 302. FIG. 3D shows the deposition of metal to create the bridge 306 and a connection 310 from the bridge 306 to the center 303 of the spiral 302. FIGS. 3E and 3E-P (plan view of 3E) shows the completed inductor with the releasable material 304 removed.

FIGS. 4A-4C (along with the corresponding plan views 4A-P to 4C-P) show an example of the creation of a capacitor for a MEMS quartz filter. FIG. 4A and plan view 4A-P shows a first electrode plate 402 and a first circuit conduit 400 deposited on the thinned-down quartz wafer 100x. FIG. 4B and plan view 4B-P shows a layer of dielectric 404 deposited over the first electrode 402. FIG. 4C and plan view 4C-P shows a second electrode plate 406 deposited over the dielectric 404 and connected to a second circuit conduit 408.

Figure 5:
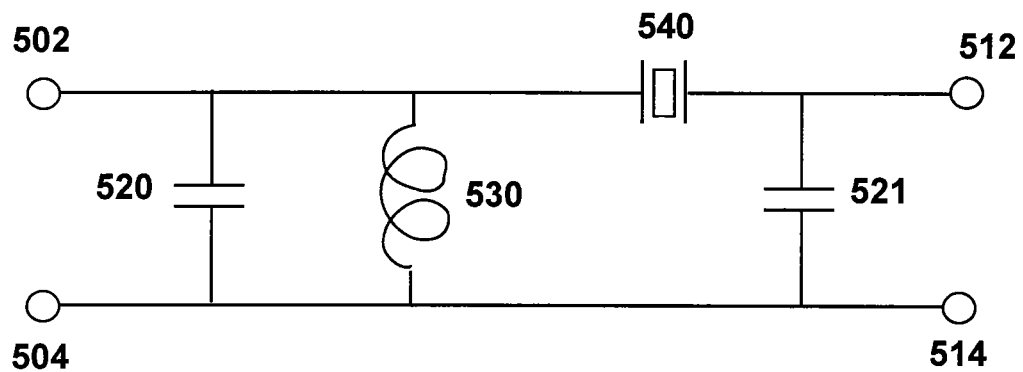
FIG. 5 depicts an example circuit diagram in accordance with the prior art that can be implemented using a MEMS quartz filter in accordance with the present disclosure.

FIG. 5 depicts an example circuit diagram of a filter using capacitors, inductors, and resonators. Other designs utilizing those elements are possible and well known in the art, including designs not requiring a resonator such as LC filters. The signal is input at the input terminals 502, 504 and the filtered signal is output at the output terminals 512, 514. This design utilizes two capacitors 520, 521 and one inductor 530 in parallel with the input terminals 502, 504, and one resonator 540 in series between the inductor 530 and one of the capacitors 521. If a resonator is not used, then the quartz substrate does not need to be made of piezoelectric quartz, but can be fabricated from fused quartz.

Figure 6A:
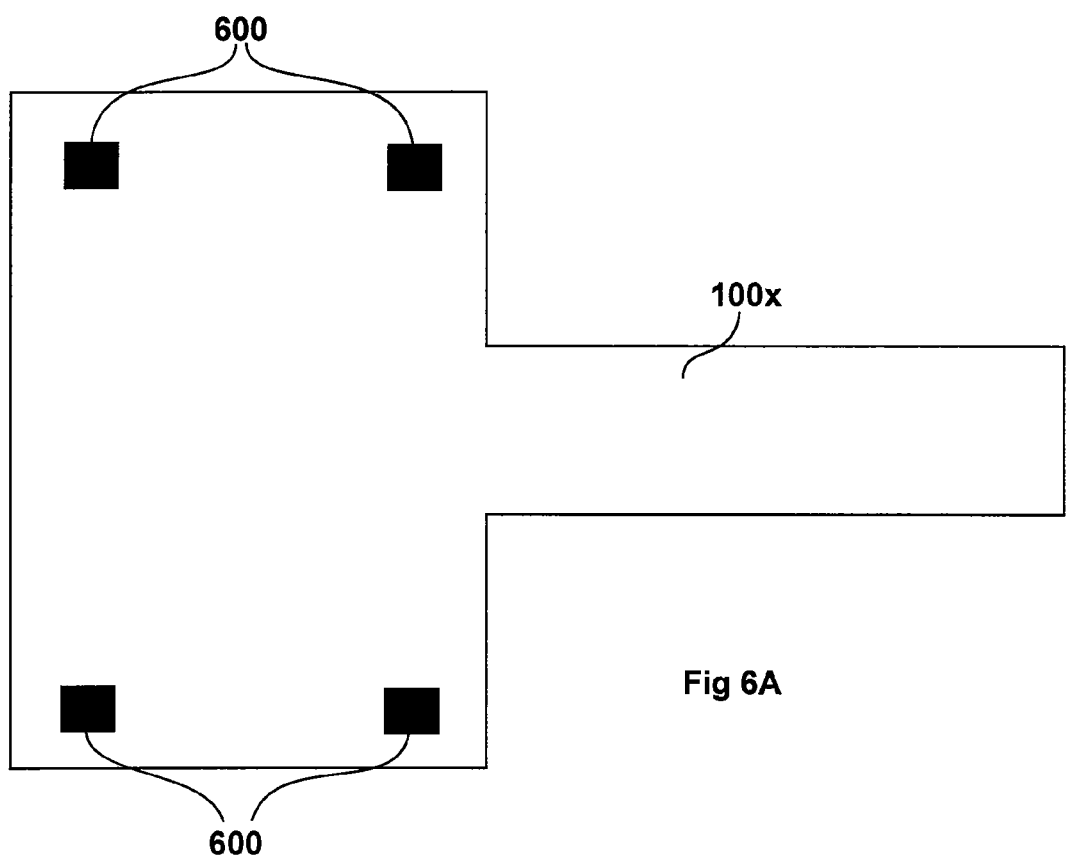

FIGS. 6A-6D depict an example of the circuit design shown in FIG. 5 implemented as a MEMS quartz filter. FIG. 6A shows a thinned-down quartz substrate 100x with four vias 600 to allow connection between the two sides of the thinned down quartz substrate 100x. The vias 600 can be etched before or after the thinning down process. The number of vias 600 may vary depending on the circuit being implemented.

FIG. 6B shows one side of the thinned down quartz substrate 100x (in this example, the top-side). The vias 600 may be connected to the input terminals 502, 504 and output terminals 512, 514 so that each input terminal 502, 504 and each output terminal 512, 514 is available on both surfaces of the thinned down quartz substrate 100x. The capacitors 520, 521 and inductor 530, which may be fabricated on the thinned-down quartz substrate 100x in accordance with the process described relative to FIGS. 4A to 4C-P and FIGS. 3A to 3E-P, respectively, are connected to input terminals 502, 504 and output terminals 512, 514 by conductive conduits 501, 503, 513, 515, 517, and 519, as shown in FIGS. 6B and 6C to implement the circuit of FIG. 5.

The top-side electrode 200 of the resonator is deposited on the thinned-down quartz substrate 100x in a location that allows it to resonate without interference from the rest of the circuit and connected by conductive circuit 610 to output terminal 512.

FIG. 6C shows the under-side elements of the filter (the figure is flipped around its horizontal axis from FIG. 6B). The input terminals 502, 504 and output terminals 512, 514 are connected to the base substrate (not shown in FIG. 6C). The under-side conductive conduit 620, which connects input terminal 502 to the underside electrode 210 may be positioned relative to conductive circuit 610 to avoid unwanted capacitive or resonating effects.

Figure 6D:
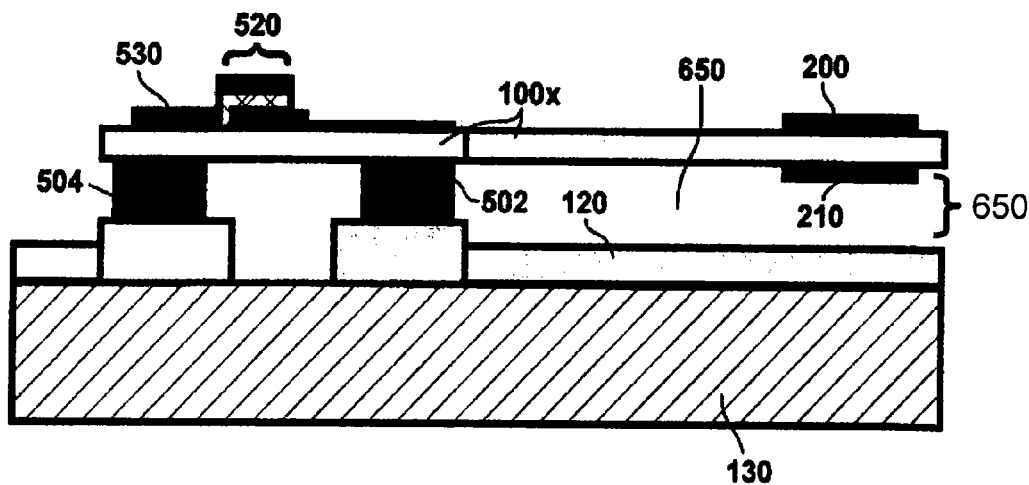

FIG. 6D shows a side-view of the MEMS quartz filter after bonding input terminals 502, 504 and output terminals 512, 514 to the base substrate 130 and subsequent release of the handle wafer 106 as described relative to FIGS. 1E and 1F. FIG. 6D also shows how the quartz substrate 100x is separated from the base substrate 130 by a gap 650 to allow the resonator (200 with 210) to resonate freely.

FIG. 6D shows only inductor 530 and capacitor 520 however it should be understood that capacitor 521 and other parts of the MEMS quartz filter are hidden from view in FIG. 6D. As described above with respect to FIG. 1A, top-side metallization 102 may include metallization for the various filter components, such as inductor 530 and capacitors 520, as shown in FIG. 6D, on the quartz substrate 100x, which results in the inductor 530 and capacitors 520 and 521 being located on the same side as top-side electrode 200 on quartz substrate 100x.

Figure 6E:
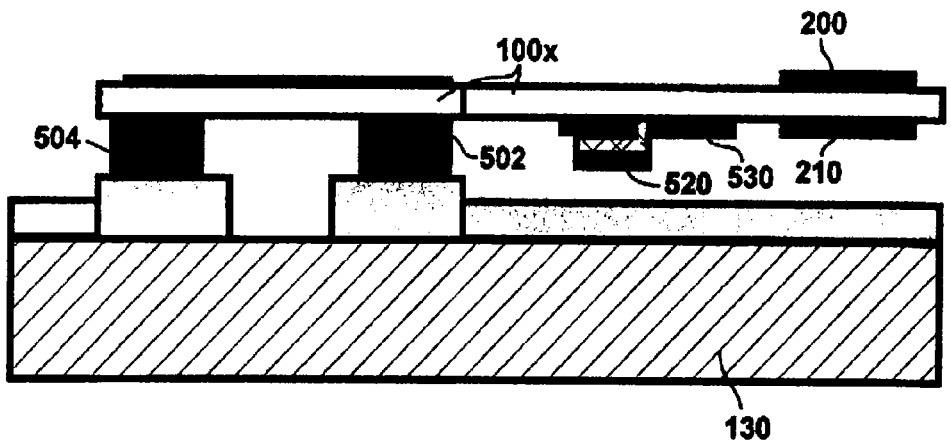
FIG. 6E depicts the structure of another example MEMS quartz filter to implement the circuit diagram of FIG. 5 in accordance with the present disclosure.

In another embodiment the various filter components, such as inductor 530 and capacitors 520 and 521 and the conductive circuits can be fabricated at the same time that the under-side metallization 112 is deposited in FIG. 1D on the thinned-down quartz substrate 100x and thereby be located on the same side as under-side electrode 210 on quartz substrate 100x. This embodiment is illustrated in FIG. 6E.

Therefore the inductors and capacitors may be located on either one side or located on both sides of the thinned-down quartz substrate 100x. Also the inductors and capacitors may be located near the top-side and under-side electrodes 200, 210 or spaced further away, and also may be located in FIG. 6E between input terminals 502 and 504.

Figure 7A:
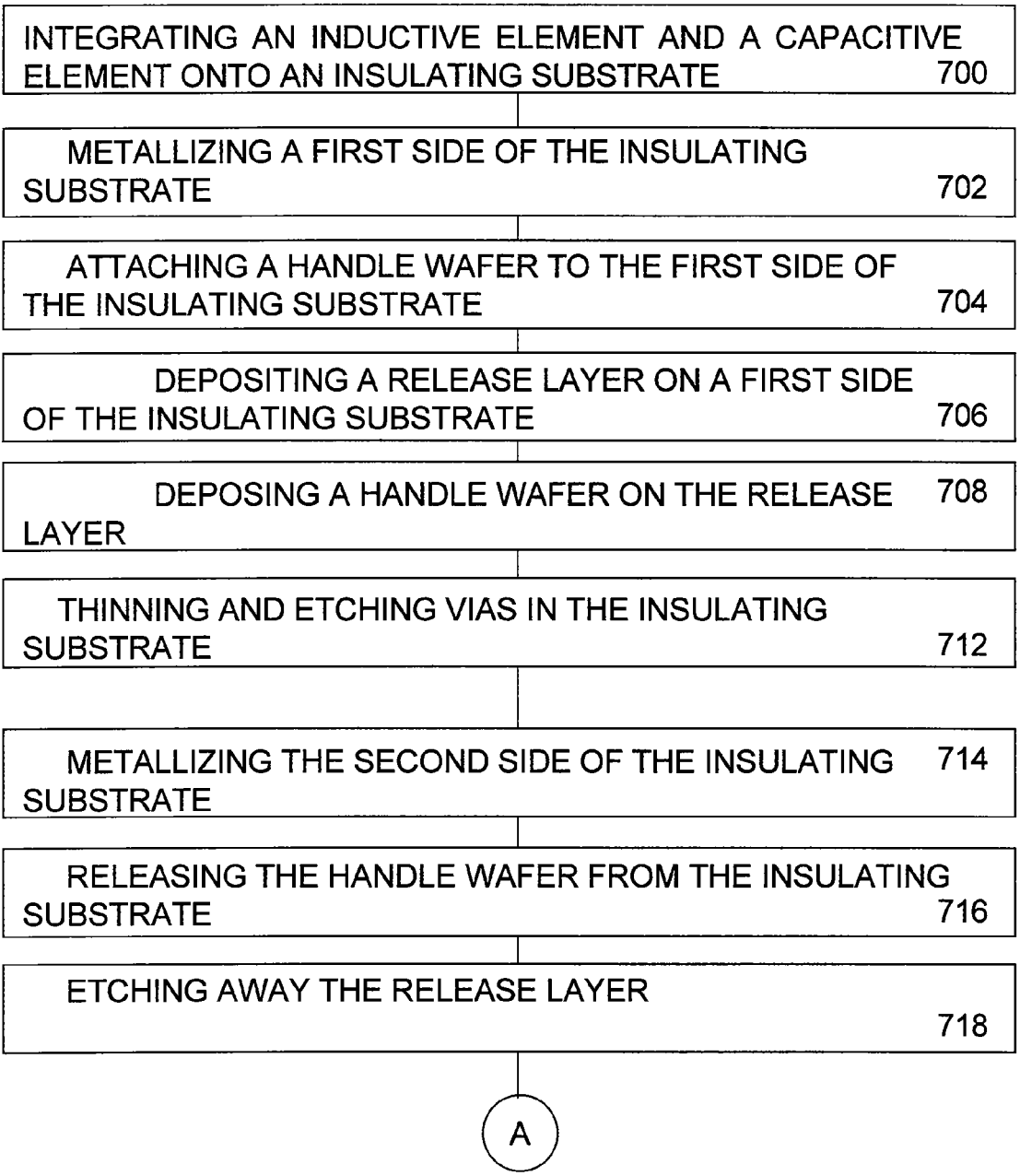

FIGS. 7A and 7B are flow diagrams of a process for fabricating an integrated Micro-Electro-Mechanical Systems (MEMS) filter in accordance with the present invention. In one embodiment in step 700 an inductive element 530 and a capacitive element 520 are integrated onto an insulating substrate 100x. In step 720 the insulating substrate 100x is bonded to a base substrate 130 such that at least a portion of the insulating substrate 100x is separated from the base substrate 130 by a gap 650. Then in step 722 a resonator element 200, 210 may be metallized on the insulating substrate 100x.

The integration step 700 may include step 702 of metallizing a first side of the insulating substrate 100x, step 704 of attaching a handle wafer 106 to the first side of the insulating substrate 100x, step 712 of thinning and etching vias 600 in the insulating substrate 100x, step 714 of metallizing the second side of the insulating substrate 100x, and step 716 of releasing the handle wafer 106 from the insulating substrate 100x. The step 716 of releasing the handle wafer 106 may include the step 718 of etching away the release layer 104.

Step 704 may include step 706 of depositing a release layer 104 on a first side of the insulating substrate 100x, and step 708 of deposing a handle wafer 106 on the release layer 104.

Step 722 may include step 724 of metallizing a first electrode 200 on a first side of the insulating substrate and step 726 of metallizing a second electrode 210 on a second side of the insulating substrate 100x opposite the first side.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. An integrated Micro-Electro-Mechanical Systems (MEMS) device comprising:
   a first substrate having a first end and a second end, the first end bonded to a base substrate and the second end of first substrate cantilevered over the base substrate and separated from the base substrate by a gap;
   an inductive element having a coil, wherein the coil of the inductive element is on the first substrate; and
   a capacitive element having two conductive plates, wherein one of the two conductive plates is on the first substrate.

2. The integrated MEMS device of claim 1, wherein the first substrate is quartz or crystalline quartz.

3. The integrated MEMS device of claim 1, wherein the inductive element includes:
   a conductive spiral having a center contact point on the first substrate;
   a further contact point exterior to the spiral on the first substrate; and
   a conductive bridge connecting the center contact point of the conductive spiral to the further contact point.

4. The integrated MEMS device of claim 1, wherein the capacitive element includes:
   a first conductive plate on the first substrate;
   a dielectric layer on the first conductive plate; and
   a second conductive plate on the dielectric layer.

5. The integrated MEMS device of claim 1 further comprising a resonator element on the first substrate.

6. The integrated MEMS device of claim 5 wherein the resonator element comprises a piezoelectric resonator.

7. An integrated Micro-Electro-Mechanical Systems (MEMS) filter comprising:
   an insulating substrate having a first end and a second end, the first end bonded to a base substrate and the second end of the insulating substrate cantilevered over the base substrate and separated from the base substrate by a gap;
   a resonator element on the second end of the insulating substrate;
   an inductive element having a coil, wherein the coil of the inductive element is on the insulating substrate; and
   a capacitive element having two conductive plates, wherein one of the two conductive plates is on the insulating substrate.

8. The integrated MEMS filter of claim 7, wherein the insulating substrate is quartz.

9. The integrated MEMS filter of claim 7, wherein the inductive element includes:
   a conductive spiral having a center contact point on the insulating substrate;
   a further contact point exterior to the spiral on the insulating substrate; and
   a conductive bridge connecting the center contact point of the conductive spiral to the further contact point.

10. The integrated MEMS filter of claim 7, wherein the capacitive element includes:
    a first conductive plate on the insulating substrate;
    a dielectric layer on the first conductive plate; and
    a second conductive plate on the dielectric layer.

11. The integrated MEMS filter of claim 7 wherein the resonator element comprises:
    a first electrode plate on a first side of the insulating substrate;
    a second electrode plate on a second side of the insulating substrate, positioned opposite to the first electrode plate such that the insulating substrate positioned between the first electrode plate and the second electrode plate is able to act as the resonator plate substrate for the resonator element.

12. The integrated MEMS filter of claim 11, wherein the insulating substrate is crystalline quartz.

13. The integrated MEMS filter of claim 1 wherein the resonator element comprises a piezoelectric resonator.

* * * * *